United States Patent [19]
Buchwald et al.

[11] Patent Number: 5,399,281
[45] Date of Patent: Mar. 21, 1995

[54] COMPOSITION WITH HYDROGEN-CONTAINING FLUOROCHLOROHYDROCARBONS

[75] Inventors: Hans Buchwald, Ronnenberg; Andreas Brackmann, Hannover; Boleslaus Raschkowski, Wiedensahl, all of Germany

[73] Assignee: Kali-Chemie AG, Hannover, Germany

[21] Appl. No.: 94,402

[22] Filed: Jul. 21, 1993

Related U.S. Application Data

[63] Continuation-in-part of Ser. No. 750,301, Aug. 27, 1991, abandoned.

[30] Foreign Application Priority Data

Aug. 30, 1990 [DE] Germany ............... 40 27 445.4

[51] Int. Cl.⁶ ............... B08B 3/08; C11D 7/30; C11D 7/50; D06B 1/00
[52] U.S. Cl. ............... 252/153; 134/38; 134/40; 134/42; 252/170; 252/171; 252/174.21; 252/194; 252/364; 252/548; 252/558
[58] Field of Search ............... 252/153, 162, 170, 171, 252/364, 174.21, 194, 548, 558; 134/38, 40, 42

[56] References Cited

U.S. PATENT DOCUMENTS

| | | | |
|---|---|---|---|
| 3,336,232 | 8/1967 | Bauer et al. | 252/153 |
| 3,355,391 | 11/1967 | Eiseman | 252/172 |
| 3,634,272 | 1/1972 | Valenta et al. | 252/153 |
| 3,954,647 | 5/1976 | Neros et al. | 252/171 |
| 3,990,844 | 11/1976 | Cormany | 252/170 |
| 4,023,927 | 5/1977 | Forschirm | 8/142 |
| 4,655,958 | 4/1987 | Jung et al. | 252/194 |

FOREIGN PATENT DOCUMENTS

| | | | |
|---|---|---|---|
| 1047357 | 1/1979 | Canada | 252/153 |
| 2823936 | 9/1979 | Germany | 252/153 |
| 1-103685 | 4/1989 | Japan . | |
| 1-129098 | 5/1989 | Japan . | |
| 1123899 | 5/1989 | Japan . | |
| 1132814 | 5/1989 | Japan . | |
| 1139779 | 6/1989 | Japan | 252/172 |
| 2204467 | 8/1990 | Japan | 252/172 |
| 1258757 | 12/1971 | United Kingdom . | |

OTHER PUBLICATIONS

*Research Disclosure* vol. 146 Jun. 1976 disclosure No. 14623 "Hydrogen-containing chlorofluorocarbons" disclosed by EI du Pont de Nemours & Co, Inc.
Patent Abstracts of Japan, abstract of Japanese Patent Publication No. JP 1,205,000 (Aug. 1989).
Patent Abstracts of Japan, abstract of Japanese Patent Publication No. JP 1,135,502 (May 1989).
Derwent Abstract of Japanese Patent Publication No. JP 1,123,899 (May 1989).
Derwent Abstract of Japanese Patent Publication No. JP 1,140,154 (Jun. 1989).

*Primary Examiner*—Linda Skaling
*Attorney, Agent, or Firm*—Evenson, McKeown, Edwards & Lenahan

[57] ABSTRACT

Cleaning compositions containing selected hydrogen-containing fluorochlorohydrocarbons, selected surface-active agents, and optional amounts of water and/or ammonia.

14 Claims, No Drawings

COMPOSITION WITH HYDROGEN-CONTAINING FLUOROCHLOROHYDROCARBONS

This is a continuation-in-part of application Ser. No. 07/750,301, filed Aug. 27, 1991, abandoned.

BACKGROUND OF THE INVENTION

This invention relates to compositions containing hydrogen-containing fluorochlorohydrocarbons, selected surface-active agents, and optionally water.

Fully halogenated fluorochlorohydrocarbons are used as solvents in a number of different cleaning and drying applications, since they satisfactorily fulfill the high requirements for dissolving properties with regard to the impurities to be removed, optionally in conjunction with conventional co-solvents or other additives for cleaning and drying applications. However, the fully halogenated fluorochlorohydrocarbons are associated with the considerable disadvantage that they contribute to the dangerous decrease in the ozone content of the upper air layers of the earth's atmosphere. Because of these properties of the fully halogenated fluorochlorohydrocarbons which damage the environment, it is desirable to replace cleaning and drying compositions containing these fully halogenated fluorochlorohydrocarbons with alternative cleaning and drying compositions containing solvents which are less dubious in this respect. However, these solvents must fulfil a series of further requirements, particularly when they are to be used for cleaning or drying electronic components, printed circuits, sensitive equipment parts, precision equipment and protective circuits, such as for example fault current protected switches. The solvents thus should not damage the objects to be cleaned or to be dried, that is they should neither have a corrosive effect on metal parts nor should they attack plastic parts.

These solvents should also be capable of forming stable water-in-oil emulsions with the other constituents of cleaning compositions, for example with surface active agents and especially with water, so that the compositions containing them can be stored for long periods of time prior to use, even at temperatures well below room temperature, without any danger of deterioration in the quality of the emulsion or of the emulsion breaking (i.e. demixing with formation of separate oil and aqueous phases).

SUMMARY OF THE INVENTION

It is the object of the present invention to provide new solvent cleaning compositions which avoid the use of potentially environmentally damaging fully halogenated fluorochlorohydrocarbons.

Another object of the invention is to provide new solvent cleaning compositions which will not damage things to be cleaned or dried, nor have a corrosive effect on metal parts or attack plastic parts.

A further object of the invention is to provide storage-stable compositions in the form of emulsions which are stable even at low temperatures, for example temperatures well below 0° C.

These and other objects of the invention are achieved by providing a cleaning composition consisting essentially of
from 0.25 to 35 wt. % of at least one surface-active agent selected from the group consisting of ammonium salts of alkylbenzenesulfonates and mixtures of fatty acid alkanol amides and alkylphenol polyglycol ethers;
at least 65 wt. % of at least one hydrogen-containing fluorochlorohydrocarbon selected from the group consisting of trichlorodifluoroethane, dichlorotrifluoroethane, dichloromonofluoroethane and dichloropentafluoropropane;
from 0 to 34.75 wt. % water, and
from 0 to 34.75 wt. % ammonia;
the sum of the components being 100 wt. %.

DETAILED DESCRIPTION OF PREFERRED EMBODIMENTS

It has now been found that cleaning compositions containing 0.25 to 35 wt. % of a surface-active agent, which is selected from ammonium salts of alkylbenzenesulfonates and/or mixtures of fatty acid alkanol amides and alkylphenol polyglycol ethers, and at least 65 wt. % of one or more hydrogen-containing fluorochlorohydrocarbons, which are selected from trichlorodifluoroethane, dichlorotrifluoroethane, dichloromonofluoroethane and dichloropentafluoropropane, and optionally water and optionally ammonia, the sum of the components being 100 wt. %, are well suited for industrial cleaning and drying processes.

In a preferred embodiment of the invention, the compositions of the invention are characterized in that they contain 0.5 to 5 wt. % of the surface-active agent relative to the total composition.

As used herein the term "trichlorodifluoroethanes" refers to fluorochlorohydrocarbons corresponding to the empirical formula $C_2HCl_3F_2$ which carry a hydrogen atom. They therefore include the three incompletely halogenated isomeric fluorochlorohydrocarbons 1,1,1-trichloro-2,2-difluoroethane (R122b), 1,1,2-trichloro-2,2-difluoroethane (R122) and 1,1,2-trichloro-1,2-difluoroethane (R122a).

As used herein the term "dichlorotrifluoroethanes" refers to fluorochlorohydrocarbons corresponding to the empirical formula $C_2HCl_2F_3$ which carry a hydrogen atom. They therefore include the three non-fully halogenated isomeric fluorochlorohydrocarbons 1,1-dichloro-2,2,2-trifluoroethane (R123), 1,2-dichloro-1,1,2-trifluoroethane (R123a), and 1,1-dichloro-1,2,2-trifluoroethane (R123b).

As used herein the term "dichloromonofluoroethanes" refers to the three fluorochlorohydrocarbons corresponding to the empirical formula $C_2H_3Cl_2F$ which carry three hydrogen atoms. They therefore include the three non-fully halogenated isomeric fluorochlorohydrocarbons 1,2-dichloro-1-fluoroethane (R141), 1,1-dichloro-2-fluoroethane (R141a) and 1,1-dichloro-1-fluoroethane (R141b).

As used herein the term "dichloropentafluoropropanes" refers to the fluorochlorohydrocarbons corresponding to the empirical formula $C_3HCl_2F_5$ which carry a hydrogen atom. In particular they include the incompletely halogenated isomeric fluorochlorohydrocarbons 1,2-dichloro-1,1,2,3,3-pentafluoropropane, 2,3-dichloro-1,1,1,2,3-pentafluoropropane, 1,1-dichloro-2,2,3,3,3-pentafluoropropane (=3,3-dichloro- 1,1,1,2,2-pentafluoropropane), 1,3-dichloro-1,1,2,2,3-pentafluoropropane, 1,1-dichloro-1,2,2,3,3-pentafluoropropane, 1,2-dichloro-1,1,3,3,3-pentafluoropropane, and 1,1-dichloro-1,2,3,3,3-pentafluoropropane. Preferred dichloropentafluoropropanes are 1,1-dichloro-2,2,3,3,3- pentafluoropropane (R225ca) and 1,3-dichloro-1,1,2,2,3-pentafluoropropane (R225cb).

The compositions of the invention may also contain the aforementioned hydrogen-containing fluorochlorohydrocarbons mixed with one another and/or as an isomeric mixture. In particular, the compositions advantageously contain hydrogen-containing fluorochlorohydrocarbons selected from the group consisting of the dichlorotrifluoroethanes, the dichloromonofluoroethanes, and mixtures thereof. Compositions which contain the dichlorotrifluoroethane isomer 1,1-dichloro-2,2,2-trifluoroethane (R123) or the dichloromonofluoroethane isomer 1,1-dichloro-1-fluoroethane (R141b), or a mixture thereof, are especially preferred. However, compositions containing other isomers, particularly dichlorotrifluoroethane or dichloromonofluoroethane, i.e. 1,2-dichloro-1,1,2-trifluoroethane (R123a), 1,1-dichloro-1,2,2-trifluoroethane (R123b), 1,2-dichloro-1-fluoroethane (R141) and 1,1-dichloro-2-fluoroethane (R141a), are also highly suitable.

In one variant of the invention, the cleaning compositions contain a mixture of fatty acid alkanol amide and alkylphenol polyglycol ether as the surface-active agent. Suitable fatty acid alkanol amides include, for example N-alkylated fatty acid amides corresponding to the formula $R^1$—CO—N($R^2$)—(CH$_2$)$_n$—OH, which can be obtained by reacting alkanol amines with fatty acids, fatty acid methyl esters or fatty acid glycerides, wherein $R^1$ represents a saturated or unsaturated fatty acid radical, $R^2$ represents hydrogen in monoalkanol amides or —(CH$_2$)$_n$—OH in fatty acid dialkanol amides, and n denotes an integer from 1 to 6, but preferably the number 2. Fatty acid dialkanol amides are particularly preferred, especially fatty acid diethanol amides in which the group $R^1$ is the fatty acid radical of lauric acid, myristic acid, palmitic acid, stearic acid, or oleic acid and optionally also a fatty acid radical of the coconut fatty acids. Suitable alkylphenol polyglycol ethers include, for example, those containing medium chain alkyl radicals, i.e. those having the C8 to C12 alkyl radicals octyl, nonyl, decyl, undecyl or dodecyl, and having 5 to 8 ethylene oxide units. In a preferred embodiment of this variant of the invention, the cleaning compositions contain a mixture of oleic acid diethanol amide and nonylphenol polyglycol ethers with 7 to 8 ethylene oxide units. Cleaning compositions in which the oleic acid diethanol amide and the nonylphenol polyglycol ethers are present in the weight ratio 5:1, are particularly preferred in this case.

Suitable alkylbenzenesulfonates include, for example, those containing medium chain alkyl radicals, i.e. those with the C8 to C12 alkyl radicals octyl, nonyl, decyl, undecyl or dodecyl. The cleaning compositions of the invention may contain ammonium salts of the alkylbenzenesulfonates with, for example, the following amines having 2 to 6 C atoms: diethylamine, n-propylamine, isopropylamine, diisopropylamine, n-butylamine, isobutylamine, tert.-butylamine, and cyclohexylamine. In a preferred embodiment of this variant of the invention, the cleaning compositions contain isopropylammonium dodecylbenzenesulfonate as an alkylbenzenesulfonate ammonium salt.

The compositions of the invention described above are very well suited for removing grease and oil impurities and for drying surfaces. In order to assist in the removal of water-soluble impurities, it is advantageous to incorporate a suitable additive for this purpose in the compositions of the invention which comprise a surface-active agent and a hydrogen-containing fluorochlorohydrocarbon. One advantageous variant of the invention therefore relates to compositions of the aforementioned type which contain a certain amount of water as a further component, in addition to the aforementioned surface-active agents and hydrogen-containing fluorochlorohydrocarbons. The water portion is very well tolerated by the compositions of the invention, i.e. stable water-in-oil emulsions are formed without diminishing the advantages of the compositions, for example by the emulsion separating into two phases (water phase and oil phase) or reverting to an oil-in-water emulsion. In this respect very advantageous cleaning compositions according to the invention in the form of a water-in-oil emulsion are characterized by containing 0.5 to 5 wt. % of the surface-active agent, 80 to 99 wt. % of one of the fluorochlorohydrocarbons dichlorotrifluoroethane or dichloromonofluoroethane, and 0.5 to 15 wt. % of water, the sum of the components being 100 wt. %.

In one preferred embodiment of this variant of the invention, the cleaning composition exists in the form of a water-in-oil emulsion and is characterized by containing 2 to 3 wt. % of the surface-active agent, 88 to 96 wt. % of one of the hydrogen-containing fluorochlorohydrocarbons dichlorotrifluoroethane or dichloromonofluoroethane, and 2 to 9 wt. % water.

The ammonium salts of alkylbenzenesulfonates in particular are used as surface-active agents for the compositions of the invention which exist in the form of a water-in-oil emulsion. A most particularly preferred alkylbenzenesulfonate ammonium salt for this is isopropylammonium dodecylbenzenesulfonate.

In one particularly advantageous embodiment of the cleaning compositions of the invention which exist in the form of a water-in-oil emulsion, the compositions are characterized by also containing 0.01 to 2 wt. % of ammonia at the expense of the proportion by weight of the hydrogen-containing fluorochlorohydrocarbon; accordingly, compositions of this type contain 78 to 98.99 wt. %, preferably 86 to 95.99 wt. %, of hydrogen-containing fluorochlorohydrocarbons, whereas the other components, such as surface-active agent and water, are present in the amounts given above for compositions in the form of water-in-oil emulsions.

Depending on the water content, the compositions of the invention are clear solutions or emulsions at room temperature to which known additives can be added. One group of known additives is stabilizers. This group includes those compounds which prevent undesirable reactions between components of the composition or with other reactants, such as for example air-oxygen, metal, water and the like. Examples of known stabilizers include nitroalkanes, in particular nitromethane and nitroethane, alkylene oxides, in particular butylene oxide, or branched alkynols, such as for example 2-methyl-but-3-yn-2-ol. These stabilizers may be used alone or in combination with one another. Amounts of stabilizer ranging from 0.01 to 5 wt. %, preferably 0.05 to 1 wt. %, relative to the total mixture are very suitable. Other suitable additives include known corrosion inhibitors, non-ionic or ionic emulsifiers, dyes, and the like.

The compositions of the invention have numerous applications in the cleaning and/or drying sector. In these known processes the object to be cleaned is immersed in one or more stages in an optionally heated liquid cleaning mixture or sprayed with the cleaning mixture. The cleaning effect may also be increased for less sensitive objects to be cleaned by suitable measures, such as for example ultrasound and/or stirring, and/or by mechanical effects, such as, for example, brushing.

The compositions of the invention are suitable for cleaning and/or drying elastomers, metal, plastic and glass parts or surfaces, and for textile cleaning (dry cleaning). The cleaning compositions of the invention are also particularly suitable for cleaning electronic components, printed circuits, sensitive equipment parts, precision equipment and protective circuits, such as for example fault current protected switches. The high requirements for cleaning these objects are satisfactorily fulfilled by the cleaning compositions of the invention.

The cleaning compositions of the invention may also be used, for example, for cleaning small parts or bulk material, or for removing grease or fingerprints from electronic components, for example from silicon wafers.

Ammonia-containing compositions are also well suited to removing oxidized surface layers from metal parts, for example from precision parts made of copper.

The present invention surprisingly results in formation of water-in-oil emulsions which exhibit very good storage stability even at temperatures significantly below 0° C. This assures that the emulsions can be suitably stored prior to use, as frequently occurs with such compositions, without any danger of formation of separate phases or deterioration in the quality of the emulsion which would adversely affect its usefulness, even in cool weather or in refrigerated storage areas.

The following examples are intended to illustrate the invention in further detail without limiting its scope. Unless otherwise stated, percentages always refer to percent by weight. The abbreviations used in the examples denote:

R122 = 1,1,2-trichloro-2,2-difluoroethane
R123 = 1,1-dichloro-2,2,2-trifluoroethane
R141b = 1,1-dichloro-1-fluoroethane
R225 = dichloropentafluoropropane (isomeric mixture of R225ca and R225cb in the weight ratio 20:80)
R225ca = 1,1-dichloro-2,2,3,3,3-pentafluoropropane
R225cb = 1,3-dichloro-1,1,2,2,3-pentafluoropropane
IDS = isopropylammonium dodecylbenzenesulfonate
ODA/NPE = oleic acid diethanol amide/nonylphenol polyglycol ether (5:1)

EXAMPLE 1:

Cleaning of glass lenses, aluminum plates and silicon slices

Cleaning tests with glass lenses, aluminum plates and silicon slices, which were contaminated with fingerprints, oil and/or grease, were carried out in a commercially available 4-chamber cleaning apparatus. The cleaning compositions, cleaning conditions and cleaning results are listed in Table 1.

TABLE 1

Cleaning results from Example 1

| No. | Compositions for bath 1 | Cleaning conditions | Material | Result |
|---|---|---|---|---|
| 1.1 | R123 emulsion: | 4-bath: | a) glass lenses | + + |
|  | 5.0% IDS | 1) 3 min. ultrasound (emulsion) | b) aluminum plates |  |
|  | 15.0% water | 2) 1 min. immersed boiling (R123) | c) silicon slices | + + |
|  | 80.0% R123 | 3) 1 min. ultrasound (R123) |  |  |
|  |  | 4) 1 min. steam degreasing (R123) |  | + + |
| 1.2 | R141b emulsion: | 4-bath: | a) glass lenses | + + |
|  | 2.0% IDS | 1) 3 min. ultrasound (emulsion) | b) aluminum plates |  |
|  | 4.0% water | 2) 1 min. immersed boiling (R141b) | c) silicon slices | + + |
|  | 94.0% R141b | 3) 1 min. ultrasound (R141b) |  |  |
|  |  | 4) 1 min. steam degreasing (R141b) |  | + + |
| 1.3 | R123/R141b emulsion: | 4-bath: (R123 or R141b) | a) glass lenses | + + |
|  |  | 1) 3 min. ultrasound (emulsion) | b) aluminum plates |  |
|  | 3.0% IDS | 2) 1 min. immersed boiling (*) | c) silicon slices | + + |
|  | 8.0% water | 3) 1 min. ultrasound (*) |  |  |
|  | 44.5% R123 | 4) 1 min. steam degreasing (*) |  | + + |
|  | 44.5% R141b |  |  |  |
| V1 | R123 | 4-bath: | a) glass lenses | poor |
|  |  | 1) 3 min. ultrasound (R123) | b) aluminum plates |  |
|  |  | 2) 1 min. immersed boiling (R123) | c) silicon slices | poor |
|  |  | 3) 1 min. ultrasound (R123) |  |  |
|  |  | 4) 1 min. steam degreasing (R123) |  | poor |
| V2 | R123 | 4-bath: | a) glass lenses | poor |
|  |  | 1) 3 min. ultrasound (R141b) | b) aluminum plates |  |
|  |  | 2) 1 min. immersed boiling (R141b) | c) silicon slices | poor |
|  |  | 3) 1 min. ultrasound (R141b) |  |  |
|  |  | 4) 1 min. steam degreasing (R141b) |  | poor |

A very good cleaning effect was achieved in the cases marked "+ +" in the "Result" column. The cleaned glass lenses, aluminum plates and silicon slices were perfectly clean and completely free of oil, grease and fingerprints when cleaned with emulsions Nos. 1.1 to 1.3 of the invention. The good results obtained in the cleaning test with compositions according to the invention are in distinct contrast to the results obtained in comparative tests V1 and V2 in which only pure solvent without surface-active agent was used.

EXAMPLE 2:

Cleaning of copper precision parts

Copper precision parts, which had an oxidized surface layer, were cleaned analogously to Example 1 in a commercially available 4-chamber cleaning apparatus. Emulsions with added ammonia were used for cleaning. The cleaning compositions, cleaning conditions and cleaning results are shown in the following Table 2.

TABLE 2

Cleaning result from Example 2

| No. | Composition for bath 1 | Cleaning conditions | Material | Result |
|---|---|---|---|---|
| 2.1 | R123 emulsion:<br>2.5% IDS<br>6.0% water<br>0.2% ammonia<br>91.3% R123 | 4-bath:<br>1) 3 min. ultrasound (emulsion)<br>2) 1 min. immersed boiling (R123)<br>3) 1 min. ultrasound (R123)<br>4) 1 min. steam degreasing (R123) | Copper precision parts, surface-oxidized | + + |

A very good cleaning effect ("++") was achieved. The oxidized surface layer was completely removed and the cleaned metal surface had a particularly good metal gloss.

EXAMPLE 3:

Cleaning of bulk material and counter mechanisms

Cleaning tests were carried out with bulk material (transistor caps) to remove drawing oils and with counter mechanisms for removing oils contaminated with resins, in a commercially available three-chamber cleaning apparatus. The cleaning compositions, cleaning conditions and cleaning results are shown in the following Table 3.

TABLE 3

Cleaning results from Example 3

| No. | Compositions for bath 1 | Cleaning conditions | Material | Result |
|---|---|---|---|---|
| 3.1 | 65.0% R123<br>35.0% ODA/NPE | 3-bath:<br>1) 3 min. ultrasound<br>2) 1 min. ultrasound (R123)<br>3) 1 min. steam degreasing (R123) | Electronic counters | + + |
| 3.2 | 95.0% R141b<br>5.0% ODA/NPE | 3-bath:<br>1) 3 min. ultrasound<br>2) 1 min. ultrasound (R141b)<br>3) 1 min. steam degreasing (R141b) | Transistor caps (bulk material) | + + |
| 3.3 | 65.0% R225<br>35.0% ODA/NPE | 3-bath:<br>1) 3 min. ultrasound<br>2) 1 min. ultrasound (R225)<br>3) 1 min. steam degreasing (R225) | Electronic counters | + + |
| 3.4 | 95.0% R122<br>5.0% ODA/NPE | 3-bath:<br>1) 3 min. ultrasound<br>2) 1 min. ultrasound (R122)<br>3) 1 min. steam degreasing (R122) | Transistor caps (bulk material) | + + |

A very good cleaning effect was achieved in the cases marked "++" in the "Result" column. In each case, the object to be cleaned or the bulk material to be cleaned was perfectly clean after the treatment.

EXAMPLE 4:

Drying of silicon slices

Drying tests on silicon slices moist with water were carried out in a commercially available 4-chamber drying apparatus. The drying compositions, drying conditions and drying results are shown in the following Table 4.

TABLE 4

Drying result from Example 4

| No. | Composition for bath 1 | Drying conditions | Material | Result |
|---|---|---|---|---|
| 4.1 | 97.0% R141b<br>3.0% IDS | 4-bath:<br>1) 1 min. immersed boiling<br>2) 1 min. immersed boiling (R141b)<br>3) 1 min. immersed boiling (R141b)<br>4) 1 min. steam chamber (R141b) | Silicon slices | + + |

A very good drying effect ("++") was achieved. The silicon slices to be dried were perfectly dry after the treatment.

The foregoing description and examples have been set forth merely to illustrate the invention and are not intended to be limiting. Since modifications of the described embodiments incorporating the spirit and substance of the invention may occur to persons skilled in the art, the scope of the invention should be construed to include all variations falling within the ambit of the appended claims and equivalents thereof.

What is claimed is:

1. A cleaning composition in the form of a stable, water-in-oil emulsion consisting essentially of
   from 0.5 to 5 wt. % of at least one surface-active agent selected from the group consisting of ammonium salts of C8 to C12 alkylbenzenesulfonates and mixtures of at least one fatty acid alkanol amide corresponding to the formula $$R^1-CO-N(R^2)-(CH_2)_n-OH$$

wherein $R^1$—CO is a saturated or unsaturated C12 to C18 fatty acid group, $R^2$ is hydrogen or a —$(CH_2)_n$—OH group, and n is an integer from 1 to 6 and at least one C8 to C12 alkylphenol polyglycol ether containing from 5 to 8 ethylene oxide units, and
   from 80 to 99 wt. % of 1,1-dichloro-1-monofluoroethane,
   from 0.5 to 15 wt. % water, and
   from 0 to 2 wt. % ammonia;
   the sum of the components being 100 wt. %.

2. A cleaning composition according to claim 1, wherein said surface active agent is a mixture of oleic acid diethanol amide and nonylphenol polyglycol ether containing 7 to 8 ethylene oxide units.

3. A cleaning composition according to claim 1, wherein the oleic acid diethanol amide and the nonylphenol polyglycol ether are present in a weight ratio of about 5:1.

4. A cleaning composition according to claim 1, wherein said surface active agent is isopropylammonium dodecylbenzenesulfonate.

5. A cleaning composition according to claim 1, containing from 2 to 3 wt. % of said surface-active agent, 88 to 96 wt. % of 1,1-dichloro-1-monofluoroethane, and from 2 to 9 wt. % water.

6. A cleaning composition according to claim 1, containing from 2 to 3 wt. % of said surface active agent, 86 to 95.99 wt. % of 1,1-dichloro1-monofluoroethane, from 2 to 9 wt. % water, and from 0.01 to 2 wt. % ammonia.

7. A cleaning composition according to claim 1, further containing 0.01 to 5 wt. % relative to the total mixture of at least one stabilizer selected from the group consisting of nitroalkanes, alkylene oxides and alkynols.

8. A cleaning composition according to claim 7, containing from 0.05 to 1 wt. % of said stabilizer.

9. A method of cleaning a surface comprising the step of contacting said surface with a composition according to claim 1.

10. A method according to claim 9, wherein said composition is sprayed on said surface.

11. A method according to claim 9, wherein said surface is immersed in said composition.

12. A method according to claim 11, wherein said surface is subjected to ultrasound while immersed in said composition.

13. A method of cleaning a textile material comprising the step of contacting said material with a cleaning composition according to claim 1.

14. A method of removing water from a wet surface comprising the step of contacting said wet surface with a cleaning composition according to claim 1.

* * * * *